United States Patent
Mikolajczak et al.

(10) Patent No.: US 6,937,454 B2
(45) Date of Patent: Aug. 30, 2005

(54) INTEGRATED DEVICE PROVIDING OVERCURRENT AND OVERVOLTAGE PROTECTION AND COMMON-MODE FILTERING TO DATA BUS INTERFACE

(75) Inventors: Adrian Mikolajczak, Mountain View, CA (US); Dean Huumala, Hayti, SD (US)

(73) Assignee: Tyco Electronics Corporation, Middletown, PA (US)

( * ) Notice: Subject to any disclaimer, the term of this patent is extended or adjusted under 35 U.S.C. 154(b) by 244 days.

(21) Appl. No.: 10/463,316

(22) Filed: Jun. 16, 2003

(65) Prior Publication Data

US 2004/0042141 A1 Mar. 4, 2004

Related U.S. Application Data

(60) Provisional application No. 60/391,866, filed on Jun. 25, 2002.

(51) Int. Cl.[7] .............................................. H02H 3/22
(52) U.S. Cl. ........................ 361/111; 361/106; 333/185
(58) Field of Search ............................... 361/106, 111; 333/12, 185

(56) References Cited

U.S. PATENT DOCUMENTS

| | | | |
|---|---|---|---|
| 4,237,441 A | 12/1980 | Van Konynenburg et al. ................. 338/22 R | |
| 4,238,812 A | 12/1980 | Middleman et al. ........ 361/106 | |
| 4,315,237 A | 2/1982 | Middleman et al. ....... 338/22 R | |
| 4,317,027 A | 2/1982 | Middleman et al. ........ 219/553 | |
| 4,426,633 A | 1/1984 | Taylor .......................... 338/25 | |
| 4,545,926 A | 10/1985 | Fouts et al. ................. 252/511 | |
| 4,689,475 A | 8/1987 | Kleiner et al. .............. 219/553 | |
| 4,724,417 A | 2/1988 | Au et al. ................... 338/22 R | |
| 4,774,024 A | 9/1988 | Deep et al. ................. 252/511 | |
| 4,780,598 A | 10/1988 | Fahey et al. ................ 219/511 | |
| 4,800,253 A | 1/1989 | Kleiner et al. .............. 219/553 | |
| 4,841,259 A | 6/1989 | Mayer ........................ 333/17.2 | |
| 4,845,838 A | 7/1989 | Jacobs et al. ................. 29/671 | |
| 4,859,836 A | 8/1989 | Lunk et al. .................. 219/548 | |
| 4,907,340 A | 3/1990 | Fang et al. ................. 29/610.1 | |
| 4,924,074 A | 5/1990 | Fang et al. .................. 219/548 | |
| 4,935,156 A | 6/1990 | Van Konynenburg et al. ............................ 219/553 | |
| 5,049,850 A | 9/1991 | Evans et al. .............. 338/22 R | |
| 5,378,407 A | 1/1995 | Chandler et al. ........... 252/513 | |
| 5,461,351 A | 10/1995 | Shusterman ................. 333/181 | |
| 5,805,431 A * | 9/1998 | Joshi et al. .................. 361/836 | |
| 5,852,397 A | 12/1998 | Chan et al. ................ 338/22 R | |
| 5,903,820 A * | 5/1999 | Hagstrom ..................... 455/82 | |
| 5,914,644 A | 6/1999 | Carter et al. .................. 333/12 | |
| 5,982,253 A | 11/1999 | Perrin et al. ................. 333/182 | |
| 6,018,448 A | 1/2000 | Anthony ....................... 361/56 | |
| 6,130,597 A | 10/2000 | Toth et al. ................ 338/22 R | |
| 6,157,528 A | 12/2000 | Anthony ..................... 361/106 | |
| 6,241,537 B1 | 6/2001 | Tate et al. ................... 439/108 | |
| 6,300,859 B1 | 10/2001 | Myong et al. .............. 337/182 | |
| 6,392,528 B1 | 5/2002 | Myong ...................... 338/22 R | |
| 6,487,084 B1 * | 11/2002 | Chu et al. .................... 361/762 | |
| 6,509,807 B1 * | 1/2003 | Anthony et al. .............. 333/12 | |
| 2004/0150500 A1 * | 8/2004 | Kiko ........................... 336/90 | |

OTHER PUBLICATIONS

Search Report for International Application No. PCT/US03/19054, mailed Apr. 22, 2004.

"Meeting IEEE 1394 overcurrent Protection Requirements Using PolySwitch Devices", Adrian Mikolajczak, Tyco Electronics Corporation, May 1, 2001.

* cited by examiner

*Primary Examiner*—Ronald Leja

(57) ABSTRACT

An electrical component includes a mounting substrate, a common-mode rejection filter mounted to the substrate, and at least one circuit protection element mounted to or formed by the substrate. The circuit protection element may provide a PPTC resistor element for overcurrent protection and/or a spark gap NTC element for overvoltage protection. The substrate includes a plurality of contacts including filter contacts connected to the common-mode rejection filter, and protection contacts connected to the protection element, the electrodes enabling surface mounting and connection of the component to aligned connection features of a host printed circuit board.

22 Claims, 4 Drawing Sheets

INTEGRATED DEVICE PROVIDING OVERCURRENT AND OVERVOLTAGE PROTECTION AND COMMON-MODE FILTERING TO DATA BUS INTERFACE

CROSS-REFERENCE TO RELATED APPLICATIONS

This application claims the benefit of U.S. Provisional Application No. 60/391,866, filed Jun. 25, 2002. The disclosure of that provisional application is incorporated herein by reference.

BACKGROUND OF THE INVENTION

1. Field of the Invention

The present invention relates to integrated electrical circuit components adapted to surface mount technology. More particularly, the present invention relates to an integrated device including overcurrent protection to a supply line as well as overvoltage protection and common-mode filtering to data lines at a data bus interface.

2. Introduction to the Invention

With the advent of digital signal processing and transmission, high speed data buses are required to interconnect computers and computer peripherals such as printers to consumer electronics products such as camcorders, VCRs, TVs, set top boxes and digital cameras. One standard bus convention is known as the IEEE 1394 multimedia connection. This particular bus convention employs two high speed differential twisted-pair data cables operating at a data transfer rate of 400 MBits/sec., or greater. It is very common for IEEE 1394 bus terminations at each device to require a common-mode filter by which common-mode noise and interference is removed from each differential pair. Another standard interface bus is the Universal Serial Bus (USB). The USB standard bus structure uses a single differential twisted pair data path for transferring data at high speed. As with the IEEE 1394 standard bus, USB terminations at each connected device can require a common-mode filter by which common-mode noise and interference is removed from the single differential pair. Another similar standard interface bus is the IEEE 802.3af powered Ethernet interface. This interface transmits both data and DC power over differential data pairs. It typically utilizes common-mode filters, overcurrent protection, and overvoltage protection.

Conventionally, a common-mode filter may be implemented as a broadband transformer comprised of two or more windings upon a ferrite core. For the IEEE 1394 bus termination the common-mode filter has comprised two pairs of windings wound through a ferrite core defining two longitudinal channels or apertures, for example. Common-mode filters of this type have typically been implemented as a component having a header for anchoring the core and a lead frame for providing connections to the windings. This filter component of the prior art typically also had soldering leads or pads enabling surface mounting and connection to a printed circuit board of the consumer device or appliance. One commercially available example of a stand-alone common-mode filter choke including a core-anchoring header and a connection lead frame for USB applications is the model C9513L common-mode choke available from CoEv, Inc., a unit of Tyco Electronics Corporation, assignee of this patent. This particular component includes a ferrite core and provides a 6 dB common-mode rolloff at approximately 60 MHz, while attenuating the differential data signal less than 1 dB at the same frequency.

Many standardized bus structures, including the IEEE 1394 serial bus, the USB serial bus, and "powered Ethernet" (e.g. IEEE 802.3af and similar technologies) as examples, provide for an on-cable power line in order to supply power to operate peripherals and network devices and circuits such as hard drives, keyboards, mice, DVD players, and computers, and/or to keep the physical layer of a device running while that particular appliance or device has its primary power supply turned off, so that the particular appliance or device can continue to identify itself and report its status to other devices and hosts on the network in order to minimize user complaints, for example.

In the IEEE 1394 bus structure, as with many other powered bus structures, overcurrent protection must also be provided. One particularly satisfactory way to provide overcurrent protection is to employ a polymeric positive temperature coefficient (PPTC) resistor, such as a PolySwitch™ PPTC resistor provided by the Raychem Circuit Protection division of Tyco Electronics Corporation, assignee of the present invention. The use of such PPTC devices within the IEEE 1394 bus structure, is described in "Meeting IEEE 1394 Overcurrent Protection Requirements Using PolySwitch Devices", authored by Adrian Mikolajczak, Tyco Electronics Corporation, May 1, 2001, the disclosure thereof being incorporated herein by reference for all purposes.

Positive temperature coefficient (PTC) circuit protection devices are well known. The device is placed in series with a load, and under normal operating conditions is in a low temperature, low electrical resistance state. However, if the current through the PTC device increases excessively and/or the ambient temperature around the PTC device increases excessively, and if either condition is maintained for sufficient time, then the PTC device will become "tripped", i.e., converted to a high temperature, high electrical resistance state such that the current flowing through the device is reduced substantially. Generally, the PTC device will remain in the tripped state, even if the current and/or temperature return to normal levels, until the PTC device has been disconnected from the power source and allowed to cool. Particularly useful PTC devices contain a PTC element which is composed of a PTC conductive polymer, i.e. a composition which comprises (1) an organic polymer, and (2) a particulate conductive filler, preferably carbon black, metal, and/or a conductive inorganic filler, e.g. a ceramic oxide or a metal carbide, nitride or boride such as titanium carbide, which is dispersed, or otherwise distributed, in the polymer. PTC conductive polymers and devices containing them are described, for example, in U.S. Pat. No. 4,237,441 (van Konynenburg et al.), U.S. Pat. No. 4,238,812 (Middleman et al.), U.S. Pat. No. 4,315,237 (Middleman et al.), U.S. Pat. No. 4,317,027 (Middleman et al.), U.S. Pat. No. 4,426,633 (Taylor), U.S. Pat. No. 4,545,926 (Fouts et al.), U.S. Pat. No. 4,689,475 (Matthiesen), U.S. Pat. No. 4,724,417 (Au et al.), U.S. Pat. No. 4,774,024 (Deep et al.), U.S. Pat. No. 4,780,598 (Fahey et al.), U.S. Pat. No. 4,800,253 (Kleiner et al.), U.S. Pat. No. 4,845,838 (Jacobs et al.), U.S. Pat. No. 4,859,836 (Lunk et al.), U.S. Pat. No. 4,907,340 (Fang et al.), U.S. Pat. No. 4,924,074 (Fang et al.), U.S. Pat. No. 4,935,156 (van Konynenburg et al.), U.S. Pat. No. 5,049,850 (Evans et al.), U.S. Pat. No. 5,378,407 (Chandler et al.), U.S. Pat. No. 5,852,397 (Chan et al.), U.S. Pat. No. 6,130,597 (Toth et al.), U.S. Pat. No. 6,300,859 (Myong et al.) and U.S. Pat. No. 6,392,528 (Myong), for example, the disclosures of which are incorporated herein by reference for all purposes. Ceramic PTC materials are also well known in the art. Negative temperature coefficient (NTC) circuit protection devices containing ceramic NTC materials are also well known in the art. For example, U.S. Pat. No. 6,300,859 (Myong et al.) describes a multi-layer circuit protection device including a layer of polymeric positive temperature coefficient resistance material sandwiched between conductive foil layers. An insulating layer is also described.

One of the problems and drawbacks of the prior art has been that the overcurrent protection device and the common-mode rejection filter, although both needed, have been separate components and have taken up valuable printed circuit board space within devices and appliances implementing powered high speed buses such as IEEE 1394, USB, or Powered Ethernet. An example of the prior art is shown in the FIG. 1 circuit schematic. Therein, an IEEE 1394 bus interface circuit 10 at a device or appliance includes an interface IC chip 12 implementing two IEEE 1394 channels feeding to two standardized 6-pin connectors 14 and 16. Power from a source 18 is passed to a power pin of connector 14 through a PPTC resistor overcurrent protection device 20. Power from the source 18 is also passed to a power pin of connector 16 through a second PPTC resistor overcurrent protection device 22. Separately, as shown in FIG. 1, two common-mode noise rejection filters 24 and 26 are provided between the channel chip 12 and each connector 14, 16 of the IEEE 1394 interface. The PPTC devices 20 and 22 and the filters 24 and 26 are separately mounted to a circuit board of the circuit 10 at the vicinity of connectors 14 and 16.

Another example of the prior art is presented in FIG. 2. Therein, a USB interface circuit 11 includes a USB interface chip 13, and two standard USB interface four-pin connectors 15 and 17. Power from a source 19 is passed to parallel-connected power pins of connectors 15 and 17 through a single PPTC resistor overcurrent protection device 21. The USB interface circuit 11 provides separate differential data pairs to each connector through a single conventional common-mode rejection filter 23. As with the IEEE 1394 example, in the USB example of FIG. 2, the PPTC resistor 21 and filter 23 are separately mounted to a host circuit board providing the USB interface.

In some implementations or a powered data bus, the designer may require additional overvoltage protection on the data and power lines to protect against undesirable and potentially damaging ESD and overvoltage surges. Typical overvoltage protection devices include TVS diodes, zener diodes, spark gap polymer materials, or other spark gap concepts. These overvoltage/ESD protection devices are typically located on the data lines, between the common mode choke and the I/O connector, or on the power line between the PPTC and the I/O connector. These are well understood in the art.

A hitherto unsolved need has arisen to provide a single, integrated device (e.g. a signal conditioning device) which combines a common-mode filter element with an overcurrent protection element and/or an over voltage protection element, thereby to save valuable printed circuit board room, to reduce component count and costs, and to reduce assembly costs otherwise associated with the particular appliance or device.

BRIEF SUMMARY OF THE INVENTION

A general object of the present invention is to provide a single electronic component combining a common-mode rejection filter with at least one other component, such as an overcurrent protection element or an overvoltage protection element in a manner overcoming limitations and drawbacks of the prior art.

Another general object of the present invention is to provide an electrical device or component suitable for surface mounting and having a layered substrate including a layer of PPTC material forming an overcurrent protection element with trace patterns, connection pads interconnected by isolated vias, and other conductive patterns, traces, pads and structures enabling the layered substrate to receive, mount and connect a wide variety of electrical components, such as coils, capacitors, resistors, diodes, etc., thereby concurrently providing other circuit functions such as common-mode noise rejection, overvoltage protection, etc., in a manner overcoming limitations and drawbacks of the prior art.

Another object of the present invention is to reduce component count, unit and manufacturing costs and circuit board space requirements for components supporting high speed digital interfaces within consumer electronics products.

In accordance with principles of the present invention, an electrical component includes a substrate adapted for surface mounting and connection to a host printed circuit board forming a bus interface circuit. The electrical component includes a common-mode rejection filter mounted to the substrate and at least one circuit protection element, such as an overcurrent protection element for protecting a power supply line of the interface from overcurrent conditions, and/or an overvoltage protection element for protecting a data line from electrostatic discharge and other overvoltage conditions. The substrate includes a plurality of connection electrodes including filter electrodes connected to the common-mode rejection filter, protection electrodes connected to the protection element, and electrodes for enabling direct mechanical and electrical connection of the component to the host printed circuit board.

In one aspect of the present invention, the overcurrent protection element is a polymeric positive temperature coefficient (PPTC) resistor element, the substrate is formed of PPTC material also forming the PPTC resistor element, and the filter electrodes are electrically isolated from the PPTC resistor element.

In a related aspect of the present invention the common-mode rejection filter is one or more multi-winding broadband transformers, each transformer formed upon a ferrite core, the windings thereof being connected to separate filter electrodes. In order to handle buses having two differential data pairs, such as an IEEE 1394 bus architecture, the multi-winding broadband transformer may comprise a ferrite core having two apertures, wherein at least a pair of windings passes through each aperture and connects to separate filter electrodes of the substrate. Alternatively, separate transformers may be provided for each pair of windings to improve isolation between the channels. Alternatively, in situations in which only one twisted pair is required, such as a USB architecture, the entire apparatus may include only one transformer with one twisted pair, connected to four filter electrodes on the substrate.

In another aspect of the present invention, an electrostatic discharge (ESD)/overvoltage protection element is connected between a filter electrode and a ground electrode of the substrate. This ESD overvoltage protection element may also be connected between a overcurrent protection electrode and ground.

The present invention also defines a surface mount electrical component having:

a flat substrate having a top major surface and a bottom major surface substantially coplanar therewith, the bottom major surface adapted to be surface-mounted to a printed circuit board, first, second, third, fourth, fifth, and sixth spaced-apart surface mount contact sets wherein a contact set includes a contact formed on the top major surface and an interconnected contact formed on the bottom major surface, a current-limiting polymeric positive temperature coefficient (PPTC) resistive element extending between first and second contact sets, and a common-mode rejection filter element comprising a pair of windings formed upon a common inductive core, the element being located at the top major surface and having one winding connected between third and fourth contact sets and having another winding connected between fifth and sixth contact sets.

In one preferred form, the substrate is a multi-layer structure having at least one layer made of the same material forming the PPTC resistive element, and in that case the third, fourth, fifth and sixth contact sets are electrically insulated from the PPTC layer. The component may also have a first overvoltage protection element connected between one of the third and fourth contact sets and ground and a second overvoltage protection element, which may be a spark gap, connected between one of the fifth and sixth contact sets and ground.

These and other objects, advantages, aspects and features of the present invention will be more fully understood and appreciated upon consideration of the detailed description of preferred embodiments presented in conjunction with the following drawings.

BRIEF DESCRIPTION OF THE DRAWINGS

The invention is illustrated by the following drawings.

DETAILED DESCRIPTION OF THE INVENTION

Figure 3:
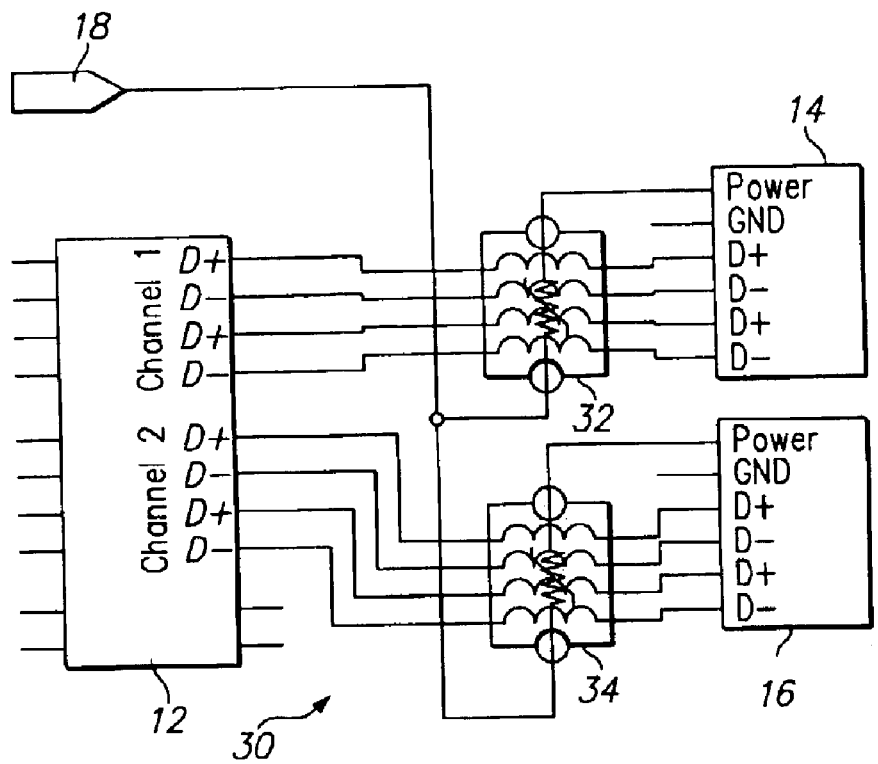
FIG. 3 is a block and schematic circuit diagram of an integrated electrical component for an IEEE 1394 interface circuit adding a common-mode rejection filter element to an overcurrent protection element providing a common mounting and connection substrate in accordance with principles of the present invention.
Figure 4:
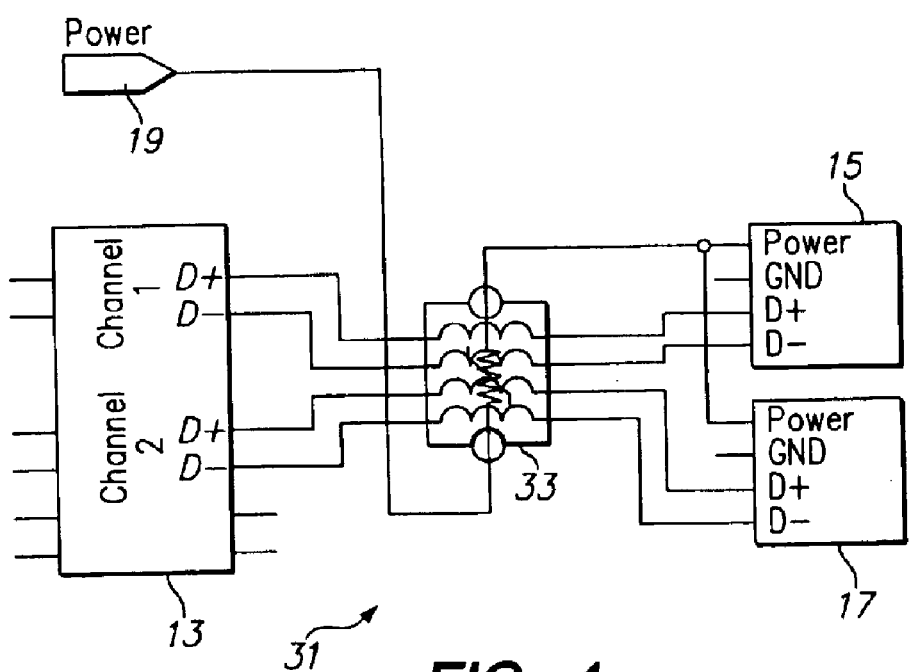
FIG. 4 is a block and schematic circuit diagram of an integrated electrical component for a USB interface circuit adding a common-mode rejection filter element to an overcurrent protection element providing a common mounting and connection substrate in accordance with principles of the present invention.

In accordance with principles of the present invention, and as shown in the circuits of FIGS. 3 and 4, multi-function devices 32, 33 and 34 primarily comprise a substrate 40. The substrate 40 most preferably includes a PPTC resistor element. The PPTC resistor element is formed by a layer 100 of PPTC material sandwiched between an insulating layer 98 and outer conductive layers 92 and 94 (see FIGS. 8A and 8B). The device 32 has two overcurrent protection terminal electrodes 42 and 44 which are electrically connected to the PPTC layer. In the example shown in FIGS. 5A, 5B, 6 and 7, for example, the overcurrent protection electrodes are formed at opposite ends of a generally rectangular, thin, box-shaped body. The PPTC resistor layer 100 may be formulated and constructed in accordance with methods and structures known in the prior art. In addition to the overcurrent protection terminal electrodes 42 and 44, the substrate 40 includes other traces, connection pads and paths. For example FIGS. 5A, 5B, 6 and 7 illustrate an integrated component having eight insulated connection paths in the form of electrodes 46, 48, 50, 52, 54, 56, 58 and 60. These electrodes 46 to 60 most preferably appear and comprise or present connection pads at a top major surface 41 and also provide connection pads at a bottom major surface 43 of the PPTC resistor body 40. Isolated vias interconnect the top connection pads with respective ones of the bottom connection pads. The number of total electrodes may be scaled up or down as needed to accommodate more or fewer data lines, respectively.

A broadband common-mode rejection filter 62 comprises a ferrite core 63 having at least one aperture. In the example of an IEEE 1394 interface presented in FIG. 3, there are two twisted-pair data lines, and the ferrite core 36 most preferably has two apertures, one for coupled, common-mode rejection windings of each data pair. A similar arrangement is preferred for use in the example of the USB interface presented in FIG. 4 wherein separate differential data pairs extend separately to each USB connector 15 and 17. Alternatively, separate filters comprising separate cores and windings may be provided for each data channel in the IEEE 1394 example as well as in the USB example, to provide greater isolation between the data channels. Alternatively a single filter constructed with a single twisted pair may be used. As is well understood by those skilled in the art, the particular filter core material, core geometry and windings are designed to provide effective common-mode noise and interference rejection based upon the requirements of a particular interface being filtered.

Figure 5A:
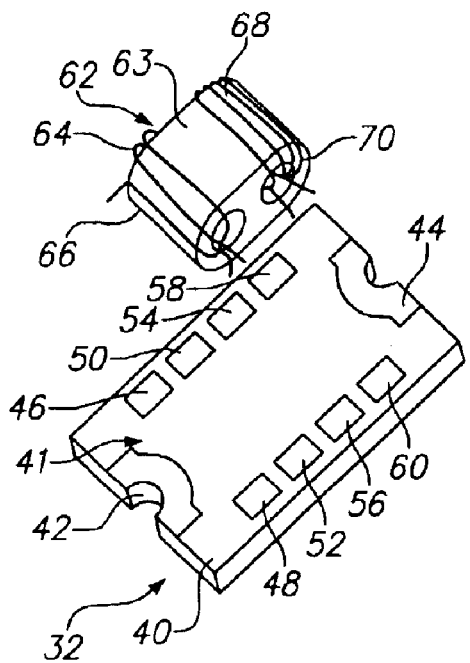
FIG. 5A is an exploded isometric assembly drawing of the FIG. 3 device; and, FIG. 5B is an isometric assembly drawing of the completed FIG. 3 device.
Figure 5B:
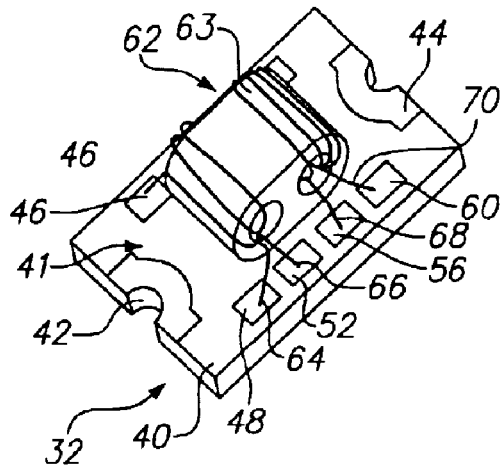
Figure 6:
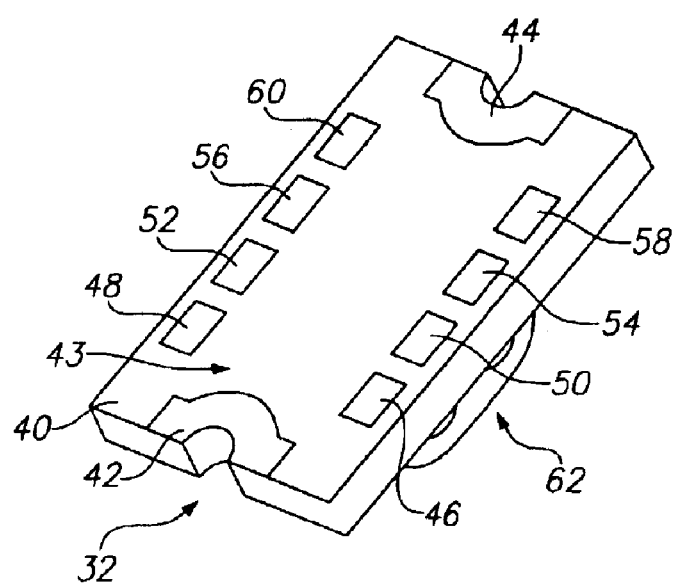
FIG. 6 is an enlarged isometric assembly drawing of the reverse side of the completed FIG. 3 device.

As shown in FIGS. 5A and 5B, a pair of windings may be provided around each aperture and an adjacent exterior wall portion of the core 63. For one data line pair, windings 64 and 66 are provided through a first aperture. For the other data line pair, windings 68 and 70 are provided through a second aperture. Alternatively, the four windings may be wound commonly around and through the two apertures of the core 63. Alternatively, separate single or multi-apertured cores may be used having windings for each differential data pair in order to increase electrical isolation between the respective data channels. While FIGS. 5A, 5B, 6 and 7 illustrate a common-mode rejection filter formed of discrete components, those skilled in the art will appreciate that the filter may be provided as a completely integrated chip inductor structure bonded by surface mounting techniques to the top of the substrate 40. In FIG. 5, the ends of winding 64 are bonded to top pads of vias 46 and 48. The ends of windings 66 are bonded to top pads of vias 50 and 52. The ends of windings 68 are bonded to top pads of vias 54 and 56; and the ends of windings 70 are bonded to top pads of vias 58 and 60. Representative connections of winding and pad are illustrated in the FIG. 5B view.

While the PPTC resistor body 40 most preferably includes a layer of PPTC resistance material, and the vias 48 to 60 are formed within insulated wells defined through the PPTC material, it is practical to form the device 32 upon a suitable dielectric substrate and define the PPTC resistor 40 as a film, layer, coating or other structural element extending between electrodes 42 and 44. By use of a dielectric substrate, rather than nominally low resistance PPTC resistor material, the vias 48 to 60 can be formed conventionally without need for electrical isolation from the PPTC resistor material.

As shown in FIG. 4, the bottom surface 43 is substantially flat and is adapted to be registered with aligned connection traces/pads and then surface-mounted to a host printed circuit board by use of conventional surface-mounting bonding techniques.

It is also practical to provide electrostatic discharge (ESD) or overvoltage protection capability to the device. Such technology and devices typically employ materials which have a very high electrical resistance under normal operating voltages, but which become highly conductive when high voltages are applied. These materials can be used to form ESD/overvoltage protection elements to short high voltage impulses to ground. Overvoltage protection elements are readily incorporated into high speed data buses and bus interfaces, such as an IEEE 1394 bus interface and the USB interface.

Figure 1:
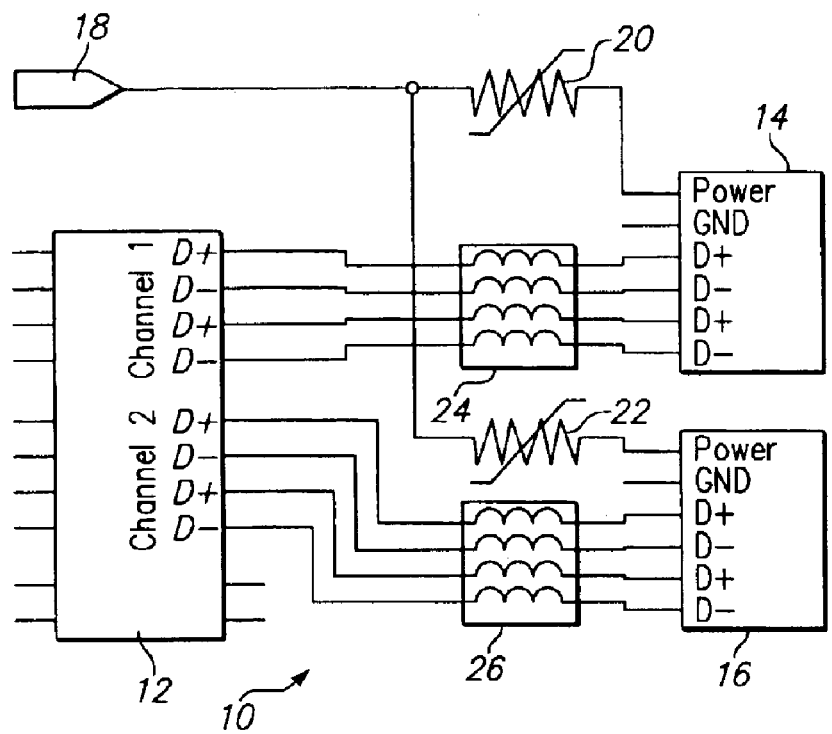
FIG. 1 is a block and schematic circuit diagram of a conventional circuit arrangement for an IEEE 1394 interface employing separate discrete components for overcurrent protection and common-mode rejection.
Figure 2:
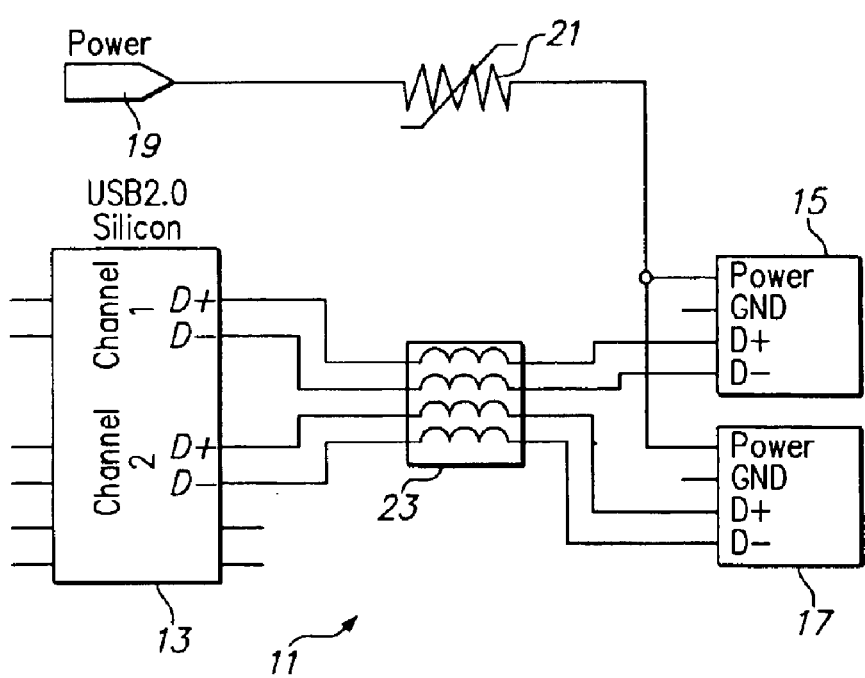
FIG. 2 is a block and schematic circuit diagram of a conventional circuit arrangement for a USB interface employing separate discrete components for overcurrent protection and common-mode rejection.
Figure 7:
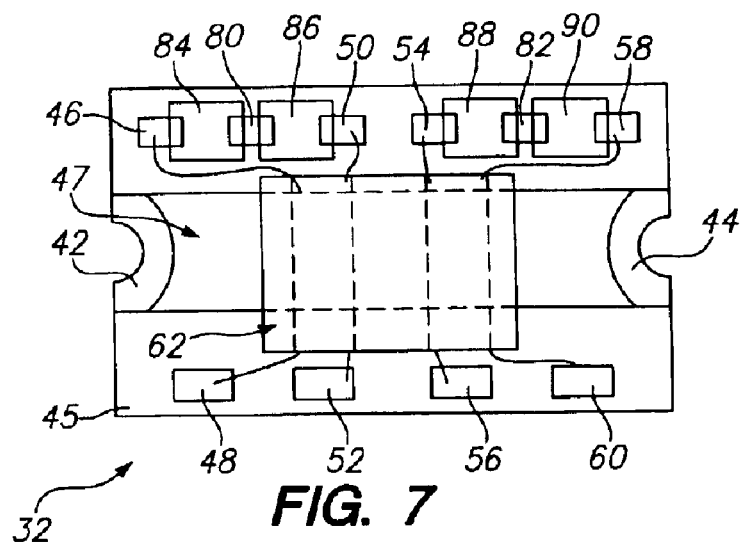
FIG. 7 is an enlarged, diagrammatic top plan view of an alternative embodiment of the present invention that adds overvoltage protection to the data lines within the FIG. 3 device.

FIG. 7 illustrates a device 34 that includes ESD/overvoltage protection. Therein, the device substrate 45 may be formed of a suitable dielectric material, such as phenolic or ceramic, and include a PPTC resistor element 47 extending between electrodes 42 and 44. The PPTC resistor element 47 may be a layer or a coating of PPTC resistive material formed integrally with the substrate 45, or the resistor element 47 may be a discretely formed component or chip that is bonded to electrodes 42 and 44 during device fabrication. Alternatively, the substrate 45 may be identical with the substrate 40 of the device 32, in which case electrodes for the common-mode rejection filter and ESD/overvoltage protection elements will be electrically isolated from the PPTC layer of the substrate. In the FIG. 7 example, the substrate 45 defines two additional vias 80 and 82 which provide suitable direct ground connections through ground plane traces of a host printed circuit board. Four overvoltage protection elements 84, 86, 88, and 90 are provided. In the FIG. 7 example, overvoltage protection elements 84 and 86 connect respectively from vias 46 and 50 to ground via 80. Overvoltage protection elements 88 and 90 connect respectively from vias 54 and 58 to ground via 82. In this particular example, the host printed circuit board connects vias 46, 50, 54 and 58 directly to an interface connector 14 or 16 as shown in FIG. 2, and connects vias 48, 52, 56 and 60 to the interface chip 12. Alternatively, the number of ground pads and connections can increase or decrease dependent on layout techniques and the number of signal electrodes being protected.

Over voltage protection elements 84 and 86 may be any suitable structures, coatings, devices or materials which respond rapidly and effectively to shunt ESD/over voltage impulses to ground and thereby protect the data bus. The overvoltage protection elements 84 to 90 may be prefabricated spark gap chips which are surface mounted to vias 46 to 58 and ground vias 80, 82. Alternatively, the overvoltage elements 84 to 90 may be applied as a paste and then cured in place. The overvoltage elements 84 to 90 may also be formed by depositing (e.g., sputtering) and etching spark gap material onto the substrate 45 forming the device 34. Alternatively, the overvoltage elements 84 to 90 may comprise high speed diodes, triacs or other semiconductor structures for shunting overvoltages above a threshold level to ground.

Figure 8A:
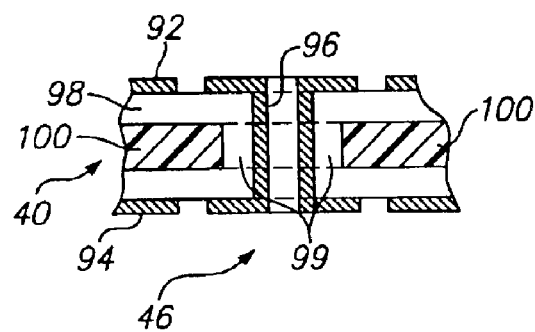
FIG. 8A is an enlarged, diagrammatic sectional view of the FIG. 3 device through an electrode isolated from a PPTC layer of the substrate; and, FIG. 8B is a similar view through an electrode connecting to the PPTC layer.
Figure 8B:
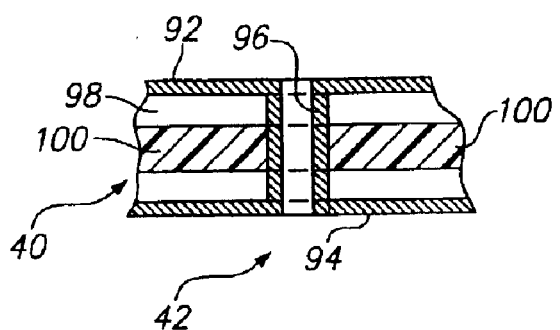

FIGS. 8A and 8B show certain structural details relating to the substrate 40. FIG. 8A shows a manner of electrical isolation of electrode 46 from the PPTC resistor material. In this illustration, the substrate 40 includes a central layer of PPTC material 100 surrounded by a top metal foil conductor layer 92, a bottom metal foil conductor layer 94, and insulating layers 98 which surround the PPTC material layer 100 and separate it from the outer conductive layers 92 and 94. The insulating layers 98 are formed of electrically insulative material, e.g. a fiber-reinforced epoxy resin or a high temperature resistant polymer film such as a polyester, polyvinylidene fluoride, or nylon. The insulating layers 98 should have a sufficient thickness to be practically manufactured and to have the desired electrical dielectric properties for insulating the PPTC layer 100 from each isolated electrode structure, such as electrode 46 shown in FIG. 8A. Also, dielectric properties and thicknesses of the insulating layer 98 are chosen to minimize parasitic distributed capacitance otherwise present at the isolated electrodes connected to the differential data lines. As shown therein the dielectric layer 98 includes regions 99 which surround and effectively separate a central conductive via 96 from the PPTC layer 100, thereby electrically isolating the electrode 46 from the overcurrent protection element. In contrast, FIG. 8B illustrates details of a non-electrically isolated electrode, which makes a direct, electrical connection to the PPTC layer 100. In FIG. 8B, the PPTC layer 100 comes into intimate contact with via 96, thereby connecting metal foils 92 and 94 which comprise top and bottom portions of electrode 42. Although not shown in FIG. 8A or 8B, it is common for PPTC layer 100 to be sandwiched directly between and be in contact with metal foil layers. These metal foil layers also make contact with via 96 for the FIG. 8B view.

Having thus described preferred embodiments of the invention, it will now be appreciated that the objects of the invention have been fully achieved, and it will be understood by those skilled in the art that many changes in construction and widely differing embodiments and applications of the invention will suggest themselves without departing from the spirit and scope of the invention. For example, electrical elements other than common-mode rejection filters and overvoltage protection elements may be attached to or formed with a substrate including a PPTC layer, thereby combining discrete elements into an integrated circuit element providing overcurrent protection as well as other related electrical functions. Therefore, the disclosures and descriptions herein are purely illustrative and are not intended to be in any sense limiting.

What is claimed is:

1. An electrical component comprising a substrate adapted for surface mounting and connection to a host printed circuit board forming a bus interface circuit, the component including a common-mode rejection filter mounted to the substrate and at least one circuit protection element, the substrate including a plurality of connection electrodes including filter electrodes connected to the filter and protection electrodes connected to the protection element, the electrodes for enabling direct mechanical and electrical connection of the component to the host printed circuit board.

2. The electrical component set forth in claim 1 wherein the protection element is an overcurrent protection element.

3. The electrical component set forth in claim 2 wherein the overcurrent protection element comprises a polymeric positive temperature coefficient (PPTC) resistor element.

4. The electrical component set forth in claim 1 wherein the substrate comprises a PPTC material layer forming the PPTC resistor element and wherein filter electrodes are electrically insulated from the PPTC material layer.

5. The electrical component set forth in claim 1 wherein the common-mode rejection filter comprises a multi-winding broadband transformer including a ferrite core and wherein the windings are connected between separate ones of the filter electrodes.

6. The electrical component set forth in claim 5 wherein the multi-winding broadband transformer comprises a ferrite core having two apertures and wherein at least a pair of windings pass through each aperture.

7. The electrical component set forth in claim 1 wherein the protection element is an overvoltage protection element.

8. The electrical component set forth in claim 7 wherein the substrate includes a ground electrode and the overvoltage protection element is connected between a filter electrode and the ground electrode.

9. The electrical component set forth in claim 1 wherein the protection element comprises an overcurrent protection element and an overvoltage protection element.

10. The electrical component set forth in claim 9 wherein the overcurrent protection element comprises a PPTC resistor between overcurrent protection connection electrodes and wherein the overvoltage protection element is connected between a filter electrode and a ground electrode of the substrate.

11. The electrical component set forth in claim 10 wherein the wherein the overvoltage protection element is connected between the overcurrent electrode and a ground electrode of the substrate.

12. An electrical device comprising:
a flat substrate having a top major surface and a bottom major surface substantially coplanar therewith, the bottom major surface adapted to be surface-mounted to a host printed circuit board,
first, second, third, fourth, fifth and sixth spaced-apart surface mount contact sets wherein a contact set includes a contact pad formed on the top major surface and an interconnected contact pad formed on the bottom major surface,
an overcurrent protection element connected between first and second contact sets, and
a multi-winding common-mode rejection filter element located at the top major surface and having a first winding connected between the third and fourth contact sets and a second winding connected between the fifth and sixth contact sets.

13. The electrical device set forth in claim 12 wherein the overcurrent protection element comprises a polymeric positive temperature coefficient (PPTC) resistor element, wherein the substrate comprises a layer of PPTC material forming the PPTC resistor element, and wherein the third, fourth, fifth and sixth contact sets are electrically insulated from the layer of PPTC material.

14. The electrical device set forth in claim 12 wherein the common-mode rejection filter element comprises a multi-winding broadband transformer including a ferrite core and wherein windings are connected respectively to top surface connection pads of the third, fourth, fifth and sixth contact sets.

15. The electrical device set forth in claim 14 wherein the device includes seventh, eighth, ninth and tenth contact sets, wherein the common-mode rejection filter element includes a second multi-winding broadband transformer including a ferrite core and windings connected respectively to top surface connection pads of the seventh, eighth, ninth and tenth contact sets.

16. The electrical device set forth in claim 14 wherein the multi-winding broadband transformer comprises a ferrite core having two apertures and wherein a first pair of windings pass through a first aperture and connect respectively to the third and fourth contact sets, wherein the substrate defines seventh, eighth, ninth and tenth contact sets and wherein a second pair of windings pass through a second aperture and connect respectively to the seventh, eighth, ninth and tenth contact sets.

17. The electrical device set forth in claim 14 wherein the substrate defines a ground contact set and further comprising a first overvoltage protection element connected between one of the third and fourth contact sets and the ground contact set, and further comprising a second overvoltage protection element connected between the fifth and sixth contact sets and the ground contact set.

18. An electrical component for a circuit supporting a powered data interface comprising:
(1) a flat substrate having:
(a) a top major surface and a bottom major surface substantially coplanar therewith,
(b) a pattern of electrically conductive top traces defined on the top major surface,
(c) a pattern of electrically conductive bottom traces defined on the bottom major surface for electrically connecting the component to a host printed circuit board providing the powered data interface,
(d) vias passing through the substrate for interconnecting separate ones of the top traces to separate ones of the bottom traces to form overcurrent protection electrodes and filter electrodes,
(e) a layer of polymeric positive temperature coefficient (PPTC) resistor material forming an overcurrent protection element for protecting a power supply to the data interface bus against overcurrent and connected to the overcurrent protection electrodes, and
(f) insulating material for isolating the filter electrodes from the overcurrent protection element, and
(2) a common-mode noise rejection filter element located at the top major surface and connected to the filter electrodes for protecting data lines of the powered data interface against common-mode interference.

19. The electrical component set forth in claim 18 wherein the common-mode noise rejection filter element comprises at least one broadband transformer having windings connected to the filter electrodes.

20. The electrical component set forth in claim 18 further comprising at least one ground electrode isolated from the overcurrent protection element and at least one overvoltage protection element connected between a filter electrode and the ground electrode.

21. The electrical component set forth in claim 20 wherein an overvoltage protection element is connected between each filter electrode and a ground electrode of the component.

22. The electrical component set forth in claim 18 wherein the pattern of electrically conductive bottom traces is arranged to enable surface mounting of the electrical component to the host printed circuit board.

* * * * *